US012586891B2

(12) United States Patent
Tzuang et al.

(10) Patent No.: US 12,586,891 B2
(45) Date of Patent: Mar. 24, 2026

(54) ANTENNA DEVICE

(71) Applicant: PanelSemi Corporation, New Taipei City (TW)

(72) Inventors: Ching-Kuang Clive Tzuang, New Taipei City (TW); Tang-Chin Hung, New Taipei City (TW); Chia-Chi Lin, New Taipei City (TW); Hsien-Te Chen, Taipei City (TW)

(73) Assignee: PANELSEMI CORPORATION, New Taipei City (TW)

( * ) Notice: Subject to any disclaimer, the term of this patent is extended or adjusted under 35 U.S.C. 154(b) by 68 days.

(21) Appl. No.: 18/799,022

(22) Filed: Aug. 9, 2024

(65) Prior Publication Data

US 2025/0055175 A1 Feb. 13, 2025

(30) Foreign Application Priority Data

Aug. 10, 2023 (TW) ................................. 112130105

(51) Int. Cl.
| | |
|---|---|
| *H01Q 1/22* | (2006.01) |
| *H01L 23/498* | (2006.01) |
| *H01L 23/552* | (2006.01) |
| *H01L 23/66* | (2006.01) |
| *H01Q 9/04* | (2006.01) |

(52) U.S. Cl.
CPC ..... *H01Q 1/2283* (2013.01); *H01L 23/49822* (2013.01); *H01L 23/49838* (2013.01); *H01L 23/552* (2013.01); *H01L 23/66* (2013.01);

*H01Q 9/0414* (2013.01); *H01Q 9/0457* (2013.01); *H01L 2223/6616* (2013.01); *H01L 2223/6677* (2013.01)

(58) Field of Classification Search
None
See application file for complete search history.

(56) References Cited

U.S. PATENT DOCUMENTS

| | | | | |
|---|---|---|---|---|
| 12,009,672 B2 * | 6/2024 | Böhler | .................... | B60L 53/66 |
| 2017/0194430 A1 * | 7/2017 | Wood | ................. | H10D 30/6735 |
| 2018/0191062 A1 * | 7/2018 | Ndip | ......................... | H01Q 1/38 |
| 2020/0236826 A1 * | 7/2020 | Baek | ..................... | G06F 1/1681 |
| 2023/0238390 A1 * | 7/2023 | Tsai | ..................... | H10D 86/441 |
| | | | | 257/66 |

(Continued)

*Primary Examiner* — Wilson Lee
(74) *Attorney, Agent, or Firm* — MUNCY, GEISSLER, OLDS & LOWE, P.C.

(57) ABSTRACT

An antenna device includes substrate layers, metallic layers, a non-shielding channel, an electronic component, a shielding layer and an antenna unit. The substrate layers include an upper substrate layer and a lower substrate layer located on two sides respectively. The metallic layers are disposed on the substrate layers. The non-shielding channel is at least defined at the upper substrate layer and communicates with the inner and outer surfaces of the upper substrate layer without being interfered by the first metallic layer. The electronic component is disposed on the outer surface of the upper substrate layer and corresponds to and at least partially covers the non-shielding channel. The shielding layer electrically shields the electronic component and is electrically connected to the first metallic layer. The antenna unit is disposed on an outer surface of the lower substrate layer and electrically coupled to the electronic component.

20 Claims, 5 Drawing Sheets

(56) References Cited

U.S. PATENT DOCUMENTS

| | | | |
|---|---|---|---|
| 2023/0246037 A1* | 8/2023 | Tseng | H10D 86/60 |
| | | | 257/71 |
| 2023/0253709 A1* | 8/2023 | Sakr | H01Q 9/045 |
| | | | 343/702 |
| 2023/0402563 A1* | 12/2023 | Lius | H01L 25/167 |
| 2024/0222871 A1* | 7/2024 | Kocer | G01R 29/0878 |

* cited by examiner

ANTENNA DEVICE

CROSS REFERENCE TO RELATED APPLICATIONS

This Non-provisional application claims priority under 35 U.S.C. § 119(a) on Patent Application No(s). 112130105 filed in Taiwan (ROC) on Aug. 10, 2023, the entire contents of which are hereby incorporated by reference.

BACKGROUND

Technology Field

The disclosure relates to an antenna device, particularly an antenna device that may shield high-frequency signal interference.

Description of Related Art

With the advancement of communication technology, the application of communication technology is also increasing, making related communication products more and more diversified. In particular, in recent years, consumers have higher and higher requirements for the function of communication products, so many communication products with different designs and functions have been proposed, and electronic products required with wireless communication are a hot trend recently.

In communication products, the antennas used in electronic equipment with wireless communication must have the characteristics of small size, good performance and low cost, so as to be widely accepted and affirmed by the market. Among many antennas, the patch antenna has the following advantages: 1. it has a planar structure and is easy to integrate with components and traces; 2. small size, low height, light weight and easy to make, suitable for mass production of printed traces; and 3. it is easy to design linear polarization, circular polarization, dual frequency, broadband and other characteristics. The patch antenna is more and more common in the application of wireless products.

In addition, with the rapid development of wireless communication technology and the continuous evolution of specifications in the past decade, various wireless technologies such as GSM, GPS, WLAN (such as Wi-Fi), Bluetooth and so on have begun to emerge and become popular in daily life. Wireless communication technology itself is broad and wildly applied, and when it is introduced into various electronic devices, it is necessary to consider the problem of high-frequency signal interference, so as to avoid signal degradation and affect the normal operation of related functions due to interference.

SUMMARY

One or more exemplary embodiments of this disclosure are to provide an antenna device that may decrease interference from high-frequency signals for normal operation.

One or more exemplary embodiments of this disclosure are to provide an antenna device, which includes a plurality of substrate layers, a plurality of metallic layers, a non-shielding channel, an electronic component, a shielding layer and an antenna unit. The substrate layers include an upper substrate layer and a lower substrate layer located on two sides respectively. The metallic layers are disposed on the substrate layers and include a first metallic layer disposed on an outer surface of the upper substrate layer. The non-shielding channel is at least defined at the upper substrate layer and communicates with an inner surface and the outer surface of the upper substrate layer, and the first metallic layer does not interfere with the non-shielding channel. The electronic component is disposed on the outer surface of the upper substrate layer and corresponds to and at least partially covers the non-shielding channel. The shielding layer electrically shields the electronic component and is electrically connected to the first metallic layer. The antenna unit is disposed on an outer surface of the lower substrate layer and electrically coupled to the electronic component.

In one or more exemplary embodiments, the shielding layer is located within the electronic component.

In one or more exemplary embodiments, the electronic component defines a top surface distant from the non-shielding channel, and the shielding layer is at least disposed on the top surface.

In one or more exemplary embodiments, the antenna device further includes a thermally-conductive insulator having a cavity being hollow, the thermally-conductive insulator fully covers the electronic component by the cavity.

In one or more exemplary embodiments, the antenna device further includes a thermally-conductive insulator having a cavity being hollow, the thermally-conductive insulator covers the electronic component by the cavity.

In one or more exemplary embodiments, the electronic component is multiple in number, the antenna device further includes a thermally-conductive insulator having a cavity being hollow, the thermally-conductive insulator covers the electronic components by the cavity.

In one or more exemplary embodiments, the shielding layer is disposed in the cavity and is at least disposed on a surface facing the non-shielding channel in the cavity.

In one or more exemplary embodiments, the electronic component transmits at least one antenna working signal to the antenna unit.

In one or more exemplary embodiments, the metallic layers further include a first magnetic structure, and the first magnetic structure has a transmittance of less than or equal to 50% for at least one antenna working signal.

In one or more exemplary embodiments, the metallic layers further include a second magnetic structure, and the second magnetic structure has a transmittance of less than or equal to 50% for at least one antenna working signal.

In one or more exemplary embodiments, the second magnetic structure further defines a reflectivity of less than or equal to 100% for at least one antenna working signal.

In one or more exemplary embodiments, the at least one antenna working signal defines a carrier frequency, and the carrier frequency is no greater than 30 GHz.

In one or more exemplary embodiments, the at least one antenna working signal defines a carrier frequency, and the carrier frequency is no less than 10 GHz.

In one or more exemplary embodiments, the at least one antenna working signal defines a carrier frequency, and the carrier frequency is no less than 26 GHz.

In one or more exemplary embodiments, the antenna unit is electrically coupled to the electronic component through electromagnetic induction.

In one or more exemplary embodiments, the non-shielding channels is single or multiple in number.

In one or more exemplary embodiments, the non-shielding channel and the electronic component are multiple in number, the non-shielding channels correspond to the electronic components, and the electronic components correspond to arrayed antenna units.

In one or more exemplary embodiments, the first metallic layer is a ground layer.

In one or more exemplary embodiments, wherein the electronic component includes a radio frequency integrated circuit (RFIC).

One or more exemplary embodiments of this disclosure are to provide an antenna device, which includes a plurality of substrate layers, a plurality of metallic layers, a non-shielding channel, an electronic component and an antenna unit. The substrate layers are stacked over with one another. The substrate layers include an upper substrate layer and a lower substrate layer located on two sides respectively, and each of the upper substrate layer and the lower substrate layer defines an outer surface facing outwardly and an inner surface facing inwardly. The metallic layers are disposed on the substrate layers respectively, and includes a first metallic layer arranged on the outer surface of the upper substrate layer and a first magnetic structure arranged between the upper substrate layer and the lower substrate layer. The non-shielding channel are at least defined at the upper substrate layer and communicates with the inner surface and the outer surface of the upper substrate layer, and the first metallic layer refrains from interfering with the non-shielding channel. The electronic component disposed on the outer surface of the upper substrate layer and corresponds to and at least partially covers the non-shielding channel. The antenna unit disposed on the outer surface of the lower substrate layer and electrically coupling to the electronic component. The electronic component transmits at least one antenna working signal to the antenna unit, and the first magnetic structure has a transmittance of less than or equal to 50% for at least one antenna working signal.

In one or more exemplary embodiments, the metallic layers further include a second magnetic structure, and the second magnetic structure has a transmittance of less than or equal to 50% for at least one antenna working signal.

In one or more exemplary embodiments, the second magnetic structure further defines a reflectivity of less than or equal to 100% for at least one antenna working signal.

In one or more exemplary embodiments, the at least one antenna working signal defines a carrier frequency, and the carrier frequency is no greater than 30 GHz.

In one or more exemplary embodiments, the at least one antenna working signal defines a carrier frequency, and the carrier frequency is no less than 10 GHz.

In one or more exemplary embodiments, the at least one antenna working signal defines a carrier frequency, and the carrier frequency is no less than 26 GHz.

In one or more exemplary embodiments, the antenna device further includes a thermally-conductive insulator having a cavity being hollow, the thermally-conductive insulator fully covers the electronic component by the cavity.

In one or more exemplary embodiments, the antenna device further includes a thermally-conductive insulator having a cavity being hollow, the thermally-conductive insulator covers the electronic component by the cavity.

In one or more exemplary embodiments, the electronic component is multiple in number, the antenna device further includes a thermally-conductive insulator having a cavity being hollow, the thermally-conductive insulator covers the electronic components by the cavity.

In one or more exemplary embodiments, the antenna device further includes a shielding layer disposed in the cavity, and the shielding layer is at least disposed on a surface facing the non-shielding channel in the cavity.

In one or more exemplary embodiments, the antenna unit is electrically coupled to the electronic component through electromagnetic induction.

In one or more exemplary embodiments, the non-shielding channels is single or multiple in number.

In one or more exemplary embodiments, the non-shielding channel and the electronic component are multiple in number, the non-shielding channels correspond to the electronic components, and the electronic components correspond to arrayed antenna units.

In one or more exemplary embodiments, the first metallic layer is a ground layer.

In one or more exemplary embodiments, the electronic component includes a radio frequency integrated circuit (RFIC).

In the antenna device of the present invention, due to the configuration and connection relationship of multiple substrate layers, multiple metallic layers, non-shielding channels, electronic components, shielding layers, and one or more antenna units, the antenna device may shield external high-frequency signals, avoiding interference with its normal operation; or in other ways, it may shield the high-frequency signals emitted by the antenna device itself, avoiding interference with neighboring electronic components during the normal operation. Additionally, in one embodiment, the design of two magnetic structures may also reduce the unnecessary modes (phases) generated when high-frequency signals are transmitted in both opposite directions, saying that high-frequency signals are transmitted through the low-frequency signal substrate layer, allowing the antenna working signals to transmit within the structure without interference and preventing signal loss during external radiation.

DETAILED DESCRIPTION OF THE DISCLOSURE

Figure 1A:
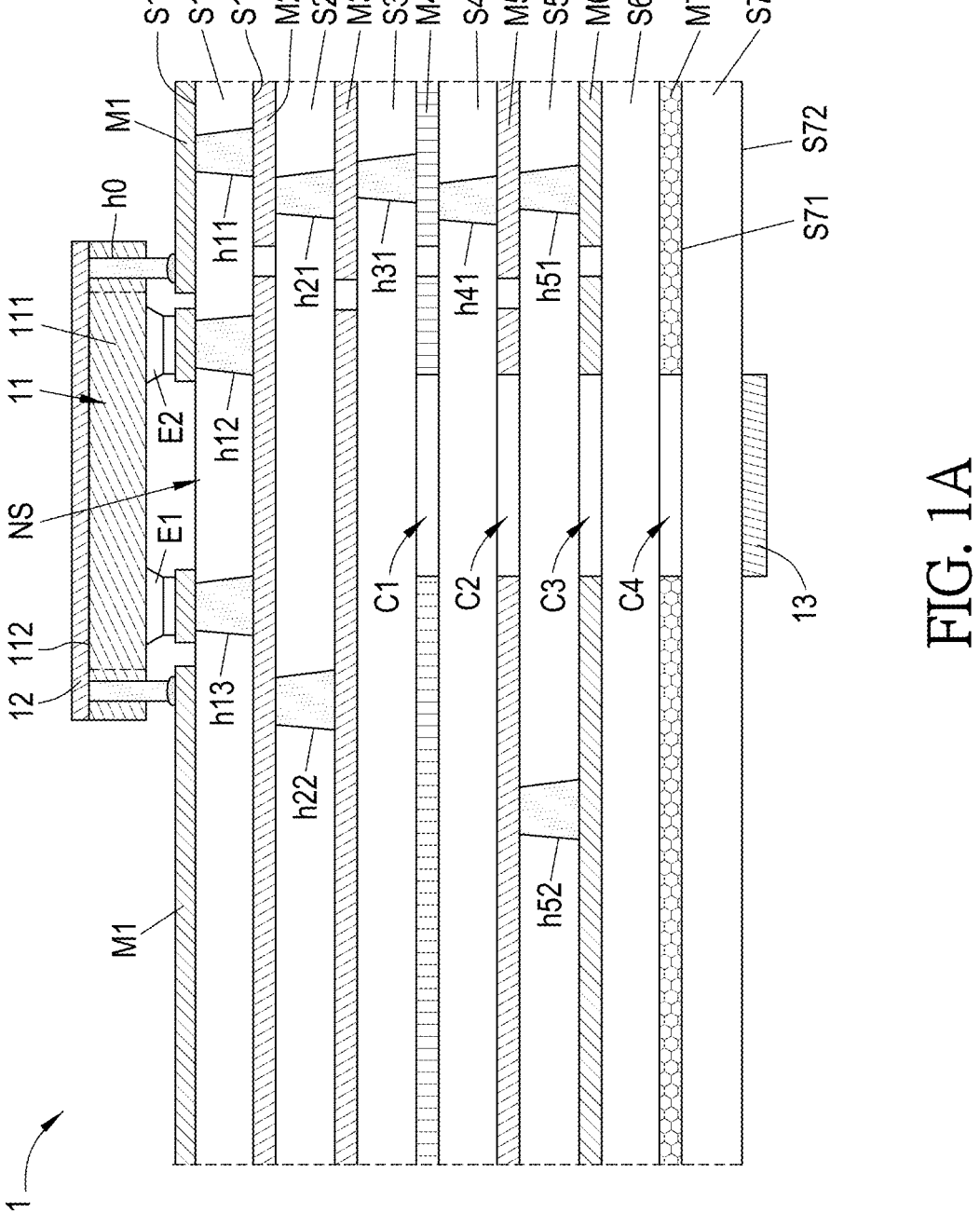
FIGS. 1A and 1B are schematic diagrams of antenna devices of different embodiments of the present invention.

The following description will refer to the relevant drawings to explain the antenna devices of some embodiments of the present invention, where the same elements will be denoted by the same reference numerals. The drawings of the embodiments are only intended to illustrate the relative relationships between the elements or units, and do not represent the actual size or proportion of the elements or units.

Figure 1B:
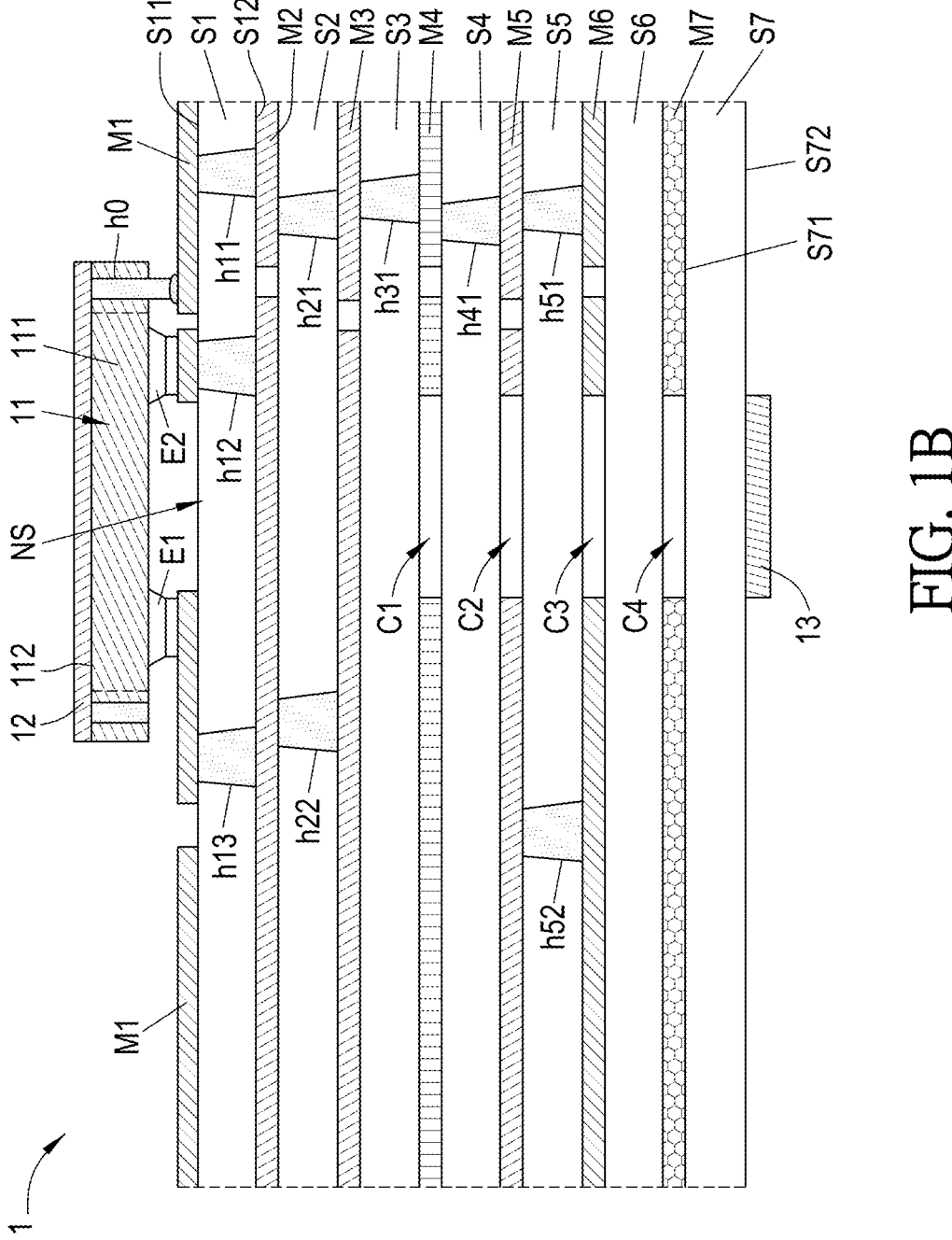

FIGS. 1A and 1B are schematic diagrams of antenna devices of different embodiments of the present invention.

First, refer to FIG. 1A. In this embodiment, the antenna device 1 includes multiple substrate layers S1 to S7, multiple metallic layers M1 to M7, at least one non-shielding channel NS, at least one electronic component 11, at least one shielding layer 12, and one or more antenna units 13. In this case, within the antenna device 1, one non-shielding channel NS, one electronic component 11, one shielding layer 12, and one units 13 are taken for example.

The substrate layers S1 to S7 are stacked with one another. In this embodiment, the substrate layers S1, S2, S3, . . . , S7 are sequentially stacked on top of each other from top to bottom. The substrate layers S1 to S7 may be referred as the substrate layers S1 and S7 located on two sides, respectively, and the substrate layers S1 and S7 define an outer surface S11, S72 and an inner surface S12, S71 corresponding to the outer surface S11, S72, respectively. Here, the substrate layer S1 is located at the upper side of the antenna device 1, and the substrate layer S7 is located at the lower side of the antenna device 1. Therefore, the substrate layer S1 may also be referred to as the upper substrate layer S1, and the substrate layer S7 may also be referred to as the lower substrate layer S7. Note that the adhesive layers between the substrate layers S1 to S7 are not shown in FIG. 1A. However, in different embodiments, adhesive layers may be provided between the substrate layers S1 and S2, S2 and S3, . . . , S6 and S7. The adhesive layers may be continuous (e.g., continuously formed along a plane) or non-continuous (e.g., discontinuously formed along a plane or formed only in regions that do not interfere with the functioning of other components). The adhesive layers may be made of an insulating adhesive, such as, but not limited to, optical clear adhesive (OCA), optical clear resin (OCR), or polyimide (PI) material. To be noted, the substrate layers S1 to S7 may be substrates individual from one another, or the substrate layers S1 to S7 may construct a single substrate structure.

The metallic layers M1 to M7 are disposed on the substrate layers S1 to S7 respectively. Each of the metallic layers M1 to M7 maybe a patterned layer, or at least of the metallic layers M1 to M7 maybe a non-patterned layer, such as a grounding layer. Practically, the ground layer is not limited to a non-patterned metal layer. In this embodiment, the quantity of metallic layers is seven (M1 to M7), and they may be patterned metallic layers, but not limited. The metallic layers M1 to M7 include a first metallic layer (metallic layer M1) disposed on the outer surface S11 of the upper substrate layer S1. The metallic layer M1 may also be referred to as the first metallic layer M1. Here, the metallic layer (first metallic layer) M1 is disposed on the outer surface S11 of the substrate layer S1; the metallic layer M2 is disposed on the substrate layer S2 and located between the substrate layers S1 and S2; the metallic layer M3 is disposed on the substrate layer S3 and located between the substrate layers S2 and S3; the metallic layer M4 is disposed on the substrate layer S4 and located between the substrate layers S3 and S4; the metallic layer M5 is disposed on the substrate layer S5 and located between the substrate layers S4 and S5; the metallic layer M6 is disposed on the substrate layer S6 and located between the substrate layers S5 and S7; and the metallic layer M7 is disposed on the substrate layer S7 and located between the substrate layers S6 and S7. The materials of the metallic layers M1 to M7 may include gold, copper, or aluminum, or any combination thereof, or any alloy of the combination, or other conductive metal materials, and are not limited.

In this embodiment, the first metallic layer M1 is electrically connected to the metallic layer M5 through the conductive via holes h11 in the substrate layer S1, h21 in the substrate layer S2, h31 in the substrate layer S3, and h41 in the substrate layer S4, and then electrically connected to the metallic layer M6 through the conductive via hole h51 in the substrate layer S5. Note that the "conductive via hole" mentioned in this text may be, for example, but not limited to, a via hole formed by a laser process that penetrates the substrate layer, and filled with a conductive material, such as tin, gold, copper, or silver, or an alloy or compound containing any of the above materials, and formed by a process such as spraying, coating, printing, or plating, and corresponding heat treatment, so that the conductive via hole may be used for conduction or signal transmission. Additionally, the first metallic layer M1 in this embodiment may be a ground layer (Ground), but it is not limited to this. In different embodiments, the first metallic layer M1 may include two types of electrically isolated conductive pattern layers, one of which may be used for grounding, and the other may be used to transmit non-ground signals, such as high-frequency or low-frequency signals, and is not limited. Additionally, the metallic layers M2, M3, M5, and M6 in this embodiment may also include two types of electrically isolated conductive pattern layers, one of which may be used for grounding, and the other may be used to transmit non-ground signals, such as high-frequency or low-frequency signals, and is not limited.

The non-shielding channel NS is at least defined in the upper substrate layer S1, connects the inner surface S12 of the upper substrate layer S1 to the outer surface S11, and the first metallic layer M1 does not interfere with the non-shielding channel NS. In other words, the location of the non-shielding channel NS defined in the upper substrate layer S1 needs to avoid the location of the first metallic layer M1; that is, the non-shielding channel NS may be located in the void in the first metallic layer M1. It is worth noting that the non-shielding channel NS is a transmission channel for high-frequency signals of the antenna, and its purpose is to allow the high-frequency signals of the antenna to pass through the substrate layer S1 and be transmitted to the antenna unit 13, or to transmit the high-frequency signals received by the antenna unit 13 through the non-shielding channel NS to the electronic component 11. In this embodiment, the non-shielding channel NS corresponds to a location directly below the electronic component 11. Additionally, the conductive via holes h12 and h13 in the substrate layer S1, and the conductive via holes h12 and h13, are electrically connected to the lead or terminal (signal terminal E1, E2) of the electronic component 11 through a connection pad and a conductive material (such as solder), thereby transmitting the high-frequency signals, low-frequency signals. Note that some of the conductive via holes may be used to transmit the low-frequency signals or ground signals required by the antenna device 1. In the above embodiment, the number of non-shielding channel NS is only one; in other embodiments, the number of non-shielding channel NS can be multiple.

The electronic component 11 is disposed on the outer surface S11 of the upper substrate layer S1 and corresponds to the non-shielding channel NS and at least partially covers the non-shielding channel NS, and the electronic component 11 is electrically connected to one of the metallic layers. Here, one electronic component 11 corresponds to one non-shielding channel NS; when the electronic component 11 and the non-shielding channel NS are multiple in number, the electronic components 11 respectively correspond to the non-shielding channels NS and at least partially covers the non-shielding channel NS. In addition, the electronic component 11 is electrically connected to one or more of the metallic layers other than the first metallic layer M1. The "electrical connection" here is not limited to direct connection (as shown in FIG. 1A) or coupling connection (as shown in FIG. 1B). Additionally, the electronic component 11 may include a signal terminal E1 and a signal terminal E2, and the signal terminals E1 and E2 may be the lead or terminal (electrode) of the electronic component 11. In this embodiment, the electronic component 11 corresponds to and completely covers the non-shielding channel NS, and the signal terminals E1 and E2 of the electronic component 11 are electrically connected to the metallic layer M2 through the conductive via holes h12 and h13, and to the metallic layer M3 through the conductive via hole h22 and are also electrically coupled to the metallic layers M4 to M7.

In this embodiment, the electronic component 11 also includes a workable component body 111, and the component body 111 is located within the electronic component 11 and is a core circuit component, and may include a line, a component, a unit, or a chip that allows the electronic component 11 to operate normally. In one embodiment, the electronic component 11 may be a flip-chip component, but is not limited to this, and uses surface-mount technology (SMT) to allow the signal terminals E1 and E2 to be electrically connected to the metallic layer M2 through a connection pad, a conductive material, and the conductive via holes h12 and h13, and to the metallic layer M3 through the conductive via hole h22. In one embodiment, the electronic component 11 may be a passive component or an active component. In one embodiment, the electronic component 11 may include a radio-frequency integrated circuit (RFIC), such as a silicon-based RFIC (Silicon RFIC) or a non-silicon-based RFIC (non-Silicon RFIC, such as a gallium arsenide single-crystal microwave integrated circuit, GaAs MMIC), to drive the corresponding antenna unit 13 to transmit wireless high-frequency (RF) signals. In one embodiment, the electronic component 11 may be a passive component, such as, but not limited to, a capacitor, a resistor, or a passive component in the narrow sense, or in the broad sense, a passive component that does not have a driving function. For example, if it is an active-matrix antenna device, the antenna device 1 may further include at least one active circuit and a passive component corresponding to the electronic component 11, and the active circuit may include, for example, a thin-film transistor (TFT) to drive the corresponding electronic component 11.

The shielding layer 12 electrically shields the electronic component 11, and the shielding layer 12 is electrically connected to the first metallic layer M1. One shielding layer 12 corresponds to one electronic component 11; when the electronic component 11 and the shielding layer 12 are multiple in number, the shielding layers 12 respectively correspond to the electronic components 11 and electrically shields the electronic component 11s. In this embodiment, the electronic component 11 also includes at least one conductive via hole h0 located outside the component body 111, and the shielding layer 12 is electrically connected to the first metallic layer M1 (ground) through the conductive via hole h0. Additionally, the electronic component 11 includes a top surface 112 that is distant from the non-shielding channel NS, and the shielding layer 12 is at least disposed on the top surface 112. In this embodiment, the shielding layer 12 is disposed on the top surface 112 of the electronic component 11. The shielding layer 12 may be a metal conductive layer, used to shield external high-frequency signals, avoiding interference with the electronic component 11 in normal operation; or, the shielding layer 12 may also shield the high-frequency signals emitted by the electronic component 11 itself, avoiding interference with the electronic component 11 in normal operation. The material of the shielding layer 12 may include gold, copper, or aluminum, or any combination thereof, or any alloy of the combination, or other conductive metal materials, and is not limited.

One or more antenna units 13 are disposed on the outer surface S72 of the lower substrate layer S7. The antenna unit 13 may be defined by a metal layer, and may be a patch antenna, and the antenna unit 13 is electrically coupled to the electronic component 11. It may be understood that FIG. 1A shows only one antenna unit 13 as an example, but the number of antenna units 13 may be multiple, and may be planar and spaced apart on the lower surface S72 of the substrate layer S7. Additionally, the embodiment in FIG. 1A shows only one electronic component 11 electrically coupled to one antenna unit 13, but it is not limited to this. In different embodiments, one electronic component 11 may also be electrically coupled to multiple, for example, four antenna units 13. Therefore, the electronic component 11 may transmit at least one antenna working signal (RF signal/high frequency signal) to one or more antenna units 13, and the antenna working signal received by the antenna unit 13 may also be transmitted to the electronic component 11. In one or more exemplary embodiments, the non-shielding channel NS and the electronic component 11 are multiple in number, the non-shielding channels NS correspond to the electronic components 11, and the electronic components correspond to arrayed antenna units 13.

In this embodiment, the metallic layers M4, M5, M6, and M7 respectively correspond to channels C1, C2, C3, and C4, which are blank areas. In detail, channels C1, C2, C3, and C4 respectively correspond to antenna unit 13, and are areas on substrate layers S4, S5, S6, and S7 where no metallic layers M4, M5, M6, and M7 are formed (i.e., blank areas). In one embodiment, channels C1, C2, C3, and C4 have the same size as antenna unit 13, but it is not limited to this. The size of channels C1, C2, C3, and C4 may be larger or smaller than antenna unit 13. In one embodiment, a carrier frequency of the antenna working signal may be defined, and the carrier frequency is no less than 10 GHz. In one embodiment, the carrier frequency is no more than 30 GHz. In one embodiment, the carrier frequency is no less than 10 GHz and no more than 30 GHz (i.e., 10 GHz≤carrier frequency≤30 GHz), the carrier frequency is, for example, but not limited to, 12 GHz. In one embodiment, the carrier frequency is no less than 26 GHz and no more than 30 GHz (i.e., 26 GHz≤carrier frequency ≤30 GHz), the carrier frequency is, for example, but not limited to, 28.8 GHz.

Worth mentioning is that substrate layers S4 to S7 in this embodiment do not form conductive via holes for transmitting antenna working signals, but in different process choices, substrate layers S4 to S7 may choose to form via holes like substrate layer S1 or S2 to transmit antenna working signals. For example, if substrate layer S5 chooses to form via holes to transmit antenna working signals, it is necessary to fill the via holes with conductive material to form conductive via holes. Additionally, if the metallic layer M6 on substrate layer S6 is a ground layer, and the location of channel C3 cannot avoid the ground layer, substrate layer S6 needs to form via holes and fill them with conductive material to transmit antenna working signals.

Therefore, when the antenna working signal emitted by electronic component 11 is transmitted to metallic layer M3 through conductive via holes h12, h13, and metallic layer M2, and conductive via hole h22, the phase angle of the antenna working signal at metallic layer M2 and metallic layer M3 may differ by 90 degrees, which is not limited. Additionally, the antenna working signal may also be transmitted to antenna unit 13 through an electrical coupling method in sequence through substrate layer S3, channel C1, substrate layer S4, channel C2, substrate layer S5, channel C3, substrate layer S6, channel C4, and substrate layer S7, thereby emitting the antenna working signal emitted by electronic component 11 through antenna unit 13. When antenna unit 13 receives the antenna working signal, it may be transmitted in reverse through an electrical coupling method in sequence through substrate layer S7, channel C4, substrate layer S6, channel C3, substrate layer S5, channel C2, substrate layer S4, channel C1, and substrate layer S3 to metallic layer M3, and then through conductive via hole h22, metallic layer M2, conductive via holes h12, and h13 to electronic component 11.

Additionally, the metallic layer M4 in this embodiment is a magnetic conductor structure (Perfect Magnetic Conductor, PMC), which functions to reduce the transmittance rate of high-frequency signals i.e., increase the reflection rate of high-frequency signals, and is referred to as a first magnetic conductor structure. The first magnetic conductor structure defines a transmittance of less than or equal to 50% for a specific antenna working signal or a segment of the specific antenna working signal, which may include at least one antenna working signal; that is, the high-frequency signal (e.g., antenna working signal) has a relatively small transmittance (e.g., less than or equal to 50%) through the first magnetic conductor structure (metallic layer M4). In this case, the function of the first magnetic conductor structure (metallic layer M4) is to allow the high-frequency signal (e.g., antenna working signal) to be transmitted downward through the channel region (C1 to C4) to the antenna unit 13, thereby reducing the unnecessary modes (phases) generated by the high-frequency signal radiating through other substrate layers (e.g., substrate layers for low-frequency signal) and allowing only a single mode of high-frequency signal to pass through the channel region (C1 to C4), while blocking at least a portion of other modes of high-frequency signals (reducing the possibility of forming of multi-mode high-frequency signals in the antenna device 1). Typically, the first magnetic conductor structure is a patterned metal layer that includes multiple repeating units. In this embodiment, the repeating units thereof are interconnected (i.e., the lines between the repeating units are not broken).

Additionally, the metallic layer M7 in this embodiment is a second magnetic conductor structure, which has a transmittance of less than or equal to 50% for at least one antenna working signal, and a reflectance of less than or equal to 100% for the antenna working signal. In other words, the high-frequency signal (e.g., antenna working signal) has a relatively small transmittance (e.g., less than or equal to 50%) through the second magnetic conductor structure (metallic layer M7), but the second magnetic conductor structure has a relatively large reflectance (e.g., close to 100%) for the high-frequency signal. In this embodiment, the repeating units within the second magnetic conductor structure are also interconnected (i.e., the lines between the repeating units are not broken). It is understandable that the repeating units of the second magnetic conductor structure is different from those of the first magnetic conductor structure. In this case, the function of the second magnetic conductor structure (metallic layer M7) is to reduce the unnecessary modes (phases) generated by the high-frequency signal radiating through other substrate layers (e.g., substrate layers for low-frequency signal) and allowing only a single mode of high-frequency signal to pass through the channel region (C1 to C4), while blocking at least a portion of other modes of high-frequency signals. It reduces the possibility of forming of multi-mode high-frequency signals in the antenna device 1 as well.

As mentioned above, in the antenna device 1 of this embodiment, the stacking of substrate layers S1 to S7 includes the upper substrate layer S1 and lower substrate layer S7 located on two sides and define outer surfaces S11 and S72 and corresponding inner surfaces S12 and S71; the metallic layers M1 to M7 are disposed on the substrate layers S1 to S7, including the first metallic layer M1 disposed on the outer surface S11 of the upper substrate layer S1; the non-shielding channel NS is defined at least in the upper substrate layer S1, connecting the inner surface S12 and the outer surface S11, and the first metallic layer M1 does not interfere with the non-shielding channel NS; the electronic component 11 is disposed on the outer surface S11 of the upper substrate layer S1, corresponding to and at least partially covering the non-shielding channel NS, and is electrically connected to one of the metallic layers M1 to M7; the shielding layer 12 electrically shields the electronic component 11 and is electrically connected to the first metallic layer M1; and the antenna unit 13 is disposed on the outer surface S72 of the lower substrate layer S7 and is electrically coupled to the electronic component 11. This design allows the antenna device 1 of the present invention to shield external high-frequency signals, reducing or preventing the interference with its normal operation; or, to shield the high-frequency signals emitted by the antenna device 1 itself, reducing or preventing the interference with the normal operation of neighboring electronic components.

Additionally, since the antenna device 1 of this embodiment has 7(N) layers of wiring, the 7(N) layers of metal may form a structure that determines 6(N−1) transmission modes, and these modes are difficult to consider in the process of signal transmission, resulting in signal loss. Therefore, this embodiment also uses the design of the first magnetic conductor structure (metallic layer M4) and the second magnetic conductor structure (metallic layer M7) to reduce the unnecessary modes (phases) generated by the high-frequency signal passing through the low-frequency signal substrate layer, allowing the antenna working signal to be transmitted within the structure without interference, and also reducing or preventing signal loss due to external radiation.

Furthermore, in one embodiment, the quantity of non-shielding channels NS, electronic components 11, and antenna units 13 may be multiple, and these electronic components 11 can be arranged in an extension direction along the outer surface S11 of the substrate layer S1, and respectively correspond to and at least partially cover the non-shielding channel NS. The antenna units 13 can be arranged in the extension direction along the outer surface S72 of the substrate layer S7. In addition, the non-shielding channels NS correspond to the electronic components 11 (e.g., one electronic component 11 corresponds to one non-shielding channel NS), and the electronic components 11 correspond to the antenna units 13 (not illustrated) arranged in an array. Specifically, in one embodiment, the antenna device 1 may be, for example, but not limited to, a phased array antenna, which has multiple electronic components 11 and multiple antenna units 13 arranged in a one-dimensional or two-dimensional array on the outer surface S72 of the lower substrate layer S7, and each electronic component 11 corresponds to a respective non-shielding channel NS and a respective antenna unit 13 in the array. Therefore, each electronic component 11 may transmit at least one antenna working signal to a respective antenna unit 13. It may be one electronic component 11 transmitting an antenna working signal to one antenna unit 13, or one electronic component 11 transmitting an antenna working signal to multiple antenna units 13 (e.g., four antenna units 13), and the present invention does not limit this.

Figure 2:
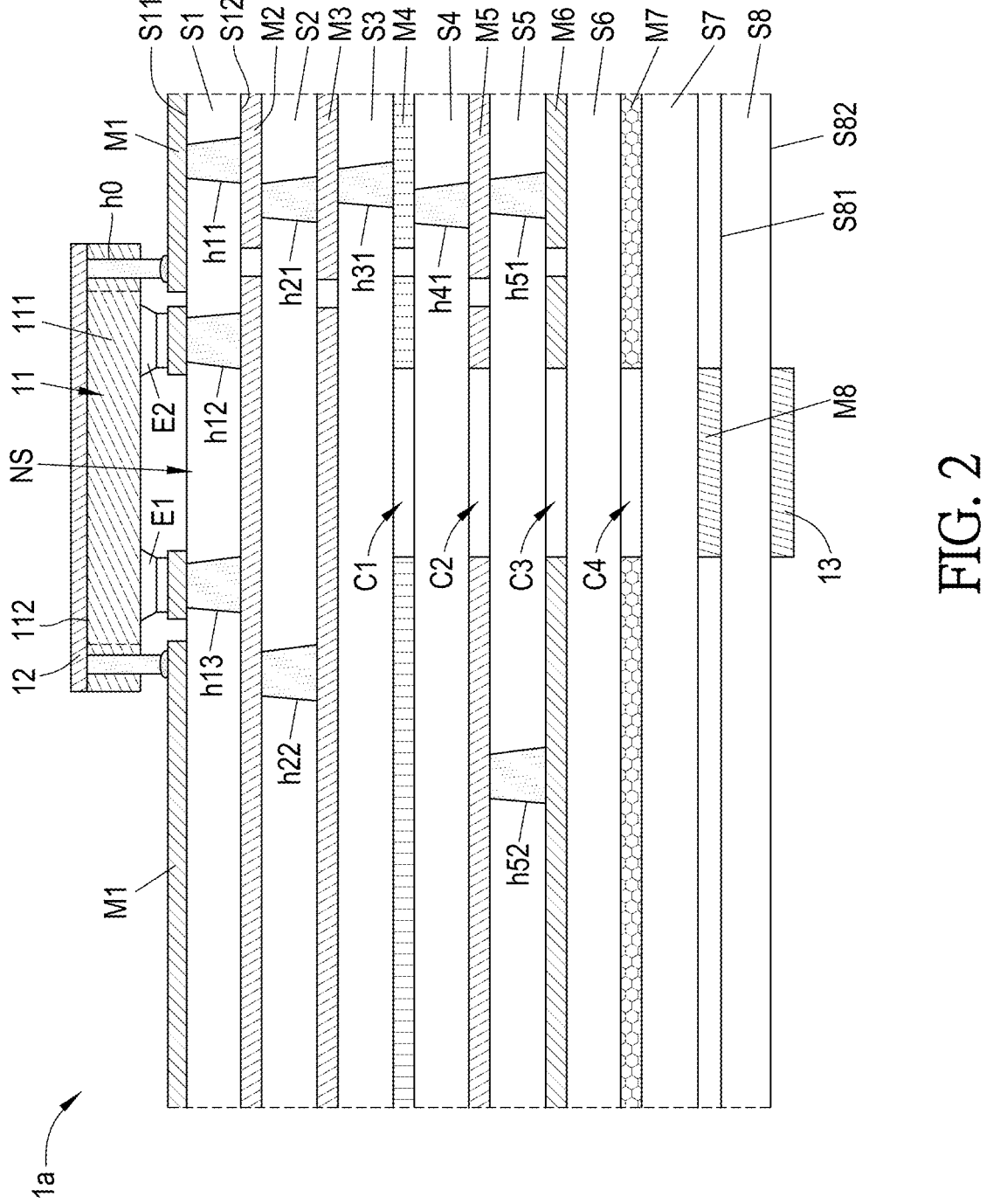
FIGS. 2 to 4 are schematic diagrams of antenna devices of different embodiments of the present invention.
Figure 3:
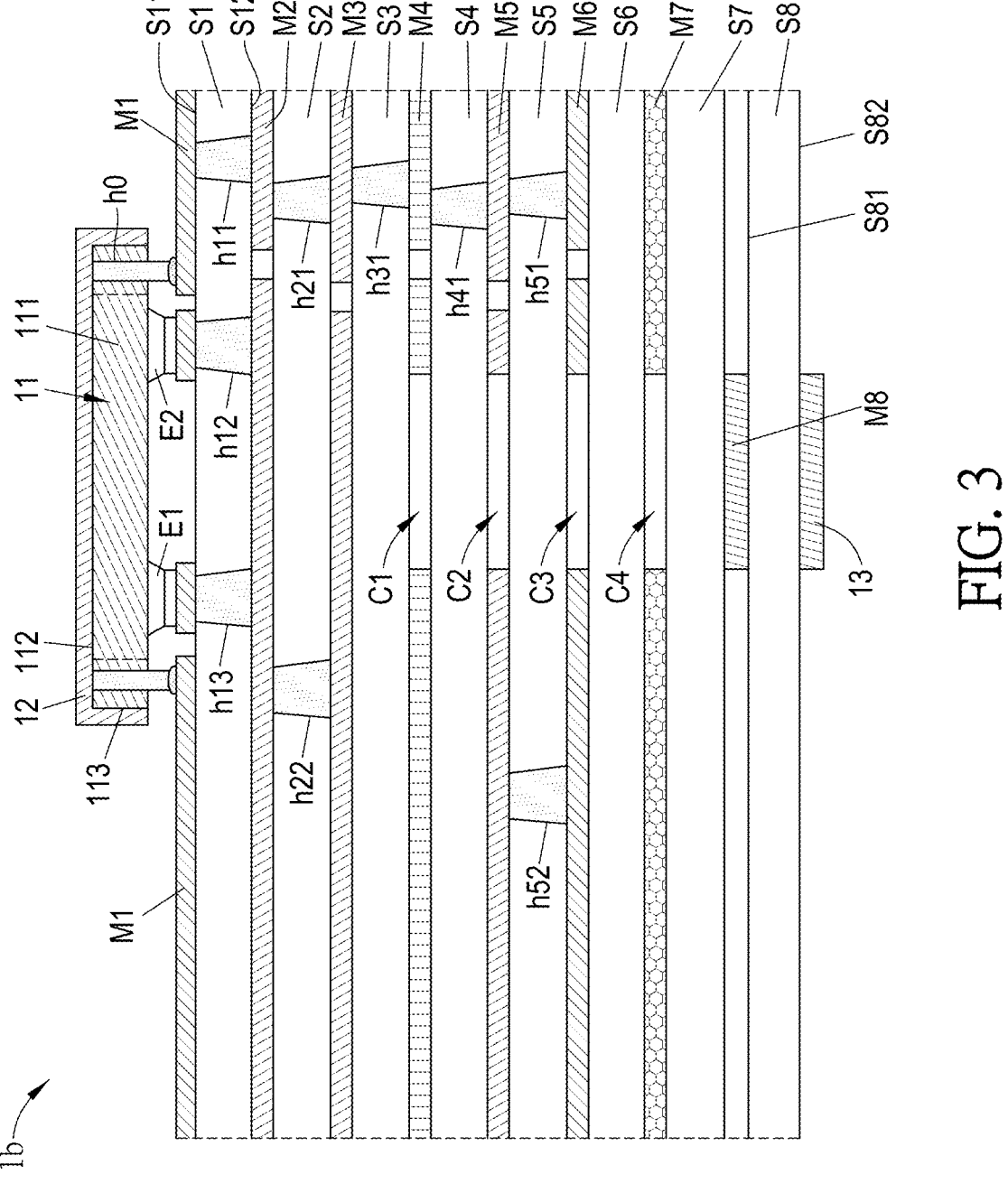
Figure 4:
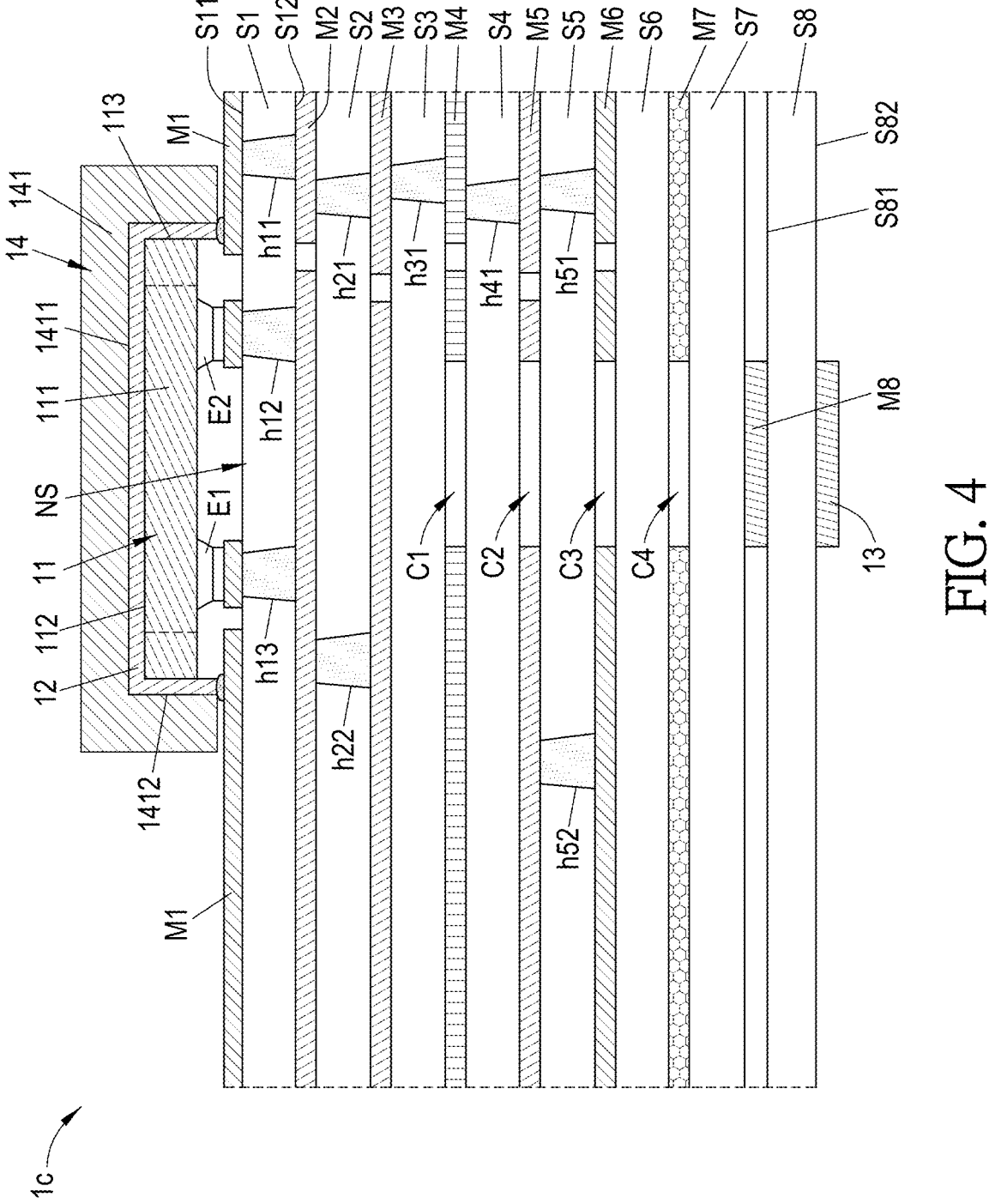

FIGS. 2 to 4 are schematic diagrams of different embodiments of the antenna device of the present invention.

As shown in FIG. 2, the antenna device 1a is similar to the antenna device 1 of the previous embodiment. The main difference between the antenna device 1*a* and the previous embodiment is that, in addition to the substrate layers S1 to S7 and the metallic layers M1 to M7, the antenna device 1*a* also includes a substrate layer S8 and a metallic layer M8. The substrate layer S8 is located between the substrate layer S7 and the antenna unit 13, and the metallic layer M8 is disposed between the substrate layer S7 and the substrate layer S8 and is set up to correspond to the antenna unit 13. In this case, the substrate layer S8 is a lower substrate layer, and the antenna unit 13 is disposed on the outer surface S82 of the substrate layer S8, and the metallic layer M8 is located on the inner surface S81 of the substrate layer S8. Therefore, the metallic layer M8 of the antenna device 1*a* is referred as an inductive layer, which allows the antenna unit 13 to be electrically coupled to the electronic component 11 through electromagnetic induction, in order to transmit the antenna working signal. Generally, the metallic layer M8 and the antenna unit 13 are in a one-to-one correspondence. Specifically, when the electronic component 11 is to drive the corresponding antenna unit 13 to transmit a wireless antenna working signal, the electronic component 11 may send an electrical signal to the metallic layer M8 (the inductive layer), and the metallic layer M8 (the inductive layer) then uses electromagnetic induction to allow the corresponding antenna unit 13 to receive the antenna working signal and transmit it out. Conversely, when the antenna unit 13 receives an electrical signal, the metallic layer M8 (the inductive layer) also uses electromagnetic induction to receive the signal and sends it to the corresponding electronic component 11.

Additionally, as shown in FIG. 3, the antenna device 1*b* is similar to the previous embodiments. The main difference is that the shielding layer 12 of the antenna device 1*b* is not only disposed on the top surface 112 of the electronic component 11, but also on the side surface 113, in order to achieve comprehensive electrical shielding. It may be understood that the shielding layer 12 may also be disposed on the side surface 113 of the electronic component 11 in the antenna devices 1 of FIG. 1A and FIG. 1B.

Furthermore, as shown in FIG. 4, the antenna device 1*c* is similar to the previous embodiments. The main difference is that the antenna device 1*c* further includes a thermally-conductive insulator 14, which, as the name suggests, is a body that combines heat conduction with electrical insulation. In this case, it is used to reduce or avoid the excess (unnecessary) modalities (phases) caused by thermal energy on the antenna device 1*c*. The thermally-conductive insulator 14 has a cavity 141 being hollow, and the thermally-conductive insulator 14 fully or at least partially covers the electronic component 11 by the cavity 141, and the shielding layer 12 is disposed in the cavity 141. In one case, "completely covered" means that the top surface 112 and the four side surfaces 113 of the electronic component 11 are all covered by the thermally-conductive insulator 14. Additionally, the shielding layer 12 is at least disposed on the surface 1411 of the cavity 141 that faces the non-shielding channel NS. In this embodiment, the shielding layer 12 is disposed on the surface 1411 and the side surface 1412 of the cavity 141. By using the cavity 141 of the thermally-conductive insulator 14 to completely cover the electronic component 11, and disposing the shielding layer 12 in the cavity 141, the design may shield external high-frequency signals, preventing interference with the normal operation of the antenna device 1*c*; or, the shielding layer 12 may shield the high-frequency signals emitted by the antenna device 1*c* itself, preventing interference with the normal operation of neighboring electronic components. It may be understood that the design of including a thermally-conductive insulator 14, which fully or at least partially covers the electronic component 11 by the cavity 141, and disposing the shielding layer 12 in the cavity 141, may also be applied to the antenna devices 1 of FIG. 1A and FIG. 1B. It is worth noting that the relationship between the number of heat-conducting insulators 14 and electronic components 11 can be one-to-one or one-to-multiple.

In the antenna devices 1*a*, 1*b*, and 1*c* shown in FIGS. 2 to 4, the number of the non-shielding channels NS, the electronic component 11, and the antenna unit 13 can also be multiple. Their corresponding relationships can be referred to the description of the antenna device 1 mentioned above and will not be repeated here.

It is worth noting that, in different embodiments, the shielding layer 12 may also be located within the electronic component 11. For example, if the electronic component 11 is a CMOS RFIC, since there are multiple metal layers inside the component body 111, one of the grounded metal layers may be used as the shielding layer 12, without needing to dispose the shielding layer 12 outside the electronic component 11.

In summary, in the antenna device of the present invention, the design of the invention including the configuration and connection relationship of multiple substrate layers, multiple metallic layers, non-shielding channels, electronic components, shielding layers, and one or more antenna units allows the antenna device to shield external high-frequency signals, preventing interference with its normal operation; or, to shield the high-frequency signals emitted by the antenna device itself, preventing interference with the normal operation of neighboring electronic components. Additionally, in one embodiment of the present invention, the design of two magnetic conductor structures may also reduce the unnecessary modes (phases) generated by the high-frequency signal passing through the low-frequency signal substrate layer, allowing the antenna working signal to be transmitted within the structure without interference, and also reducing or preventing signal loss due to external radiation.

The above-described embodiments are only examples and are not intended to be limiting. Any modifications or changes that are equivalent to the spirit and scope of the present invention and are made without departing from the scope of the present invention, should be included within the scope of the claims.

What is claimed is:

1. An antenna device, comprising:
   a plurality of substrate layers stacked over with one another, including an upper substrate layer and a lower substrate layer located on two sides respectively, wherein each of the upper substrate layer and the lower substrate layer defines an outer surface facing outwardly and an inner surface facing inwardly;
   a plurality of metallic layers disposed on the substrate layers respectively and including a first metallic layer arranged on the upper substrate layer;
   a non-shielding channel at least defined at the upper substrate layer and communicating with the inner surface and the outer surface of the upper substrate layer; wherein the first metallic layer refrains from interfering with the non-shielding channel;
   an electronic component disposed on the outer surface of the upper substrate layer and corresponds to and at least partially covers the non-shielding channel;

a shielding layer electrically shielding the electronic com-
ponent and is electrically connected to the first metallic
layer, and an antenna unit disposed on the outer surface of the lower
substrate layer and electrically coupling to the elec-
tronic component.

2. The antenna device as claimed in claim 1, wherein the
shielding layer is located within the electronic component.

3. The antenna device as claimed in claim 1, wherein the
electronic component defines a top surface distant from the
non-shielding channel, and the shielding layer is at least
disposed on the top surface.

4. The antenna device as claimed in claim 1, further
including a thermally-conductive insulator having a cavity
being hollow, the thermally-conductive insulator covers the
electronic component by the cavity.

5. The antenna device as claimed in claim 4, wherein the
shielding layer is disposed in the cavity and is at least
disposed on a surface facing the non-shielding channel in the
cavity.

6. The antenna device as claimed in claim 1, wherein the
electronic component transmits at least one antenna working
signal to the antenna unit, and the metallic layers further
include a first magnetic structure, and the first magnetic
structure defines a transmittance of less than or equal to 50%
for at least one antenna working signal.

7. The antenna device as claimed in claim 1, wherein the
antenna unit is electrically coupled to the electronic com-
ponent through electromagnetic induction.

8. The antenna device as claimed in claim 1, wherein the
first metallic layer is a ground layer.

9. The antenna device as claimed in claim 1, wherein the
electronic component includes a radio frequency integrated
circuit (RFIC).

10. An antenna device, comprising:

a plurality of substrate layers stacked over with one
another, including an upper substrate layer and a lower
substrate layer located on two sides respectively,
wherein each of the upper substrate layer and the lower
substrate layer defines an outer surface facing out-
wardly and an inner surface facing inwardly;

a plurality of metallic layers disposed on the substrate
layers respectively, and including a first metallic layer
arranged on the upper substrate layer and a first mag-
netic structure arranged between the upper substrate
layer and the lower substrate layer;

a non-shielding channel at least defined at the upper
substrate layer and communicating with the inner sur-
face and the outer surface of the upper substrate layer;

wherein the first metallic layer refrains from interfering
with the non-shielding channel;

an electronic component disposed on the outer surface of
the upper substrate layer and corresponds to and at least
partially covers the non-shielding channel; and an antenna unit disposed on the outer surface of the lower
substrate layer and electrically coupling to the elec-
tronic component;

wherein the electronic component transmits at least one
antenna working signal to the antenna unit;

wherein the first magnetic structure defines a transmit-
tance of less than or equal to 50% for at least one
antenna working signal.

11. The antenna device as claimed in claim 10, wherein
the metallic layers further include a second magnetic struc-
ture, and the second magnetic structure defines a transmit-
tance of less than or equal to 50% for at least one antenna
working signal.

12. The antenna device as claimed in claim 11, wherein
the second magnetic structure further defines a reflectivity of
less than or equal to 100% for at least one antenna working
signal.

13. The antenna device as claimed in claim 10, wherein
the at least one antenna working signal defines a carrier
frequency, and the carrier frequency is no greater than 30
GHz.

14. The antenna device as claimed in claim 10, wherein
the at least one antenna working signal defines a carrier
frequency, and the carrier frequency is no less than 10 GHz.

15. The antenna device as claimed in claim 14, wherein
the carrier frequency is no less than 26 GHz.

16. The antenna device as claimed in claim 10, further
including a thermally-conductive insulator, which has a
cavity being hollow, the thermally-conductive insulator cov-
ers the electronic component by the cavity.

17. The antenna device as claimed in claim 16, further
including a shielding layer disposed in the cavity, wherein
the shielding layer is at least disposed on a surface facing the
non-shielding channel in the cavity.

18. The antenna device as claimed in claim 10, wherein
the antenna unit is electrically coupled to the electronic
component through electromagnetic induction.

19. The antenna device as claimed in claim 10 wherein the
first metallic layer is a ground layer.

20. The antenna device as claimed in claim 10, wherein
the electronic component includes a radio frequency inte-
grated circuit (RFIC).

*     *     *     *     *